United States Patent
Pye et al.

(10) Patent No.: US 11,134,353 B2
(45) Date of Patent: Sep. 28, 2021

(54) CUSTOMIZED AUDIO PROCESSING BASED ON USER-SPECIFIC AND HARDWARE-SPECIFIC AUDIO INFORMATION

(71) Applicant: HARMAN INTERNATIONAL INDUSTRIES, INCORPORATED, Stamford, CT (US)

(72) Inventors: Daniel Timothy Pye, San Francisco, CA (US); Sean Edward Olive, Oak Park, CA (US); Todd S. Welti, Thousand Oaks, CA (US); Omid Khonsaripour, Thousand Oaks, CA (US); Kadagattur Gopinatha Srinidhi, Karnataka (IN); Christopher Ludwig, Blooming Hills, MI (US); Michael Knappe, West Bloomfield, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 16/730,064

(22) Filed: Dec. 30, 2019

(65) Prior Publication Data

US 2020/0221240 A1 Jul. 9, 2020

Related U.S. Application Data

(60) Provisional application No. 62/788,677, filed on Jan. 4, 2019.

(51) Int. Cl.
*H04R 29/00* (2006.01)
*G06F 3/16* (2006.01)
(Continued)

(52) U.S. Cl.
CPC .......... *H04R 29/001* (2013.01); *G06F 3/165* (2013.01); *H03G 5/165* (2013.01); *H04R 3/04* (2013.01); *H04R 2420/05* (2013.01)

(58) Field of Classification Search
CPC .. H04R 2420/07; H04R 1/1016; H04R 25/70; H04R 3/00; H04R 2430/01; H04R 5/04;
(Continued)

(56) References Cited

U.S. PATENT DOCUMENTS 10,048,930 B1 8/2018 Vega et al.
2011/0293123 A1* 12/2011 Neumeyer ........... H04R 25/558
381/314

(Continued)

OTHER PUBLICATIONS

Extended European Search Report for application No. 20150160.8 dated May 28, 2020.

*Primary Examiner* — Norman Yu
(74) *Attorney, Agent, or Firm* — Artegis Law Group, LLP

(57) ABSTRACT

A method of audio signal processing, the method comprising: accessing user-specific audio processing information for a particular user; determining identity information of an audio device for producing sound output from an audio signal; based on the identity information of the audio device, accessing device-specific audio processing information for the audio device; generating a customized audio-processing procedure for the audio signal based on the user-specific audio processing information and the device-specific audio processing information; and generating a customized audio signal by processing the audio signal with the customized audio-processing procedure.

20 Claims, 5 Drawing Sheets

(51) Int. Cl.
*H03G 5/16* (2006.01)
*H04R 3/04* (2006.01)

(58) Field of Classification Search
CPC ...... H04R 27/00; H04R 25/30; H04R 29/001; H04R 3/04; H04R 2420/05; H04S 7/301; H04S 7/304; G06F 3/165; H03G 5/165
USPC ........ 381/370, 314, 315, 317, 328, 59, 23.1, 381/309, 71.1, 71.11, 56, 74; 455/570
See application file for complete search history.

(56) References Cited

U.S. PATENT DOCUMENTS

| | | | |
|---|---|---|---|
| 2012/0183165 A1* | 7/2012 | Foo | H04R 25/50 381/314 |
| 2013/0177188 A1* | 7/2013 | Apfel | A61B 5/0022 381/315 |
| 2014/0153727 A1 | 6/2014 | Walsh et al. | |
| 2014/0254828 A1 | 9/2014 | Ray et al. | |
| 2014/0334644 A1* | 11/2014 | Selig | G06F 3/165 381/108 |
| 2015/0078575 A1 | 3/2015 | Selig et al. | |
| 2015/0271607 A1 | 9/2015 | Sabin | |
| 2016/0366518 A1* | 12/2016 | Strogis | H04S 7/306 |

\* cited by examiner

CUSTOMIZED AUDIO PROCESSING BASED ON USER-SPECIFIC AND HARDWARE-SPECIFIC AUDIO INFORMATION

CROSS-REFERENCE TO RELATED APPLICATIONS

The present application claims the priority benefit of U.S. Provisional Application titled, "PERSONALIZED AUDIO EXPERIENCE ACROSS MULTIPLE DEVICES," filed Jan. 4, 2019 and having Ser. No. 62/788,677. The subject matter of this related application is hereby incorporated by reference in its entirety.

BACKGROUND

Field of the Embodiments

Embodiments of the present disclosure relate generally to audio devices and, more specifically, to customized audio processing based on user-specific and hardware-specific audio information.

Description of the Related Art

In the realm of audio entertainment, the audio experience of a listener can be colored by various aspects of the current audio environment (e.g., a room, a vehicle, a set of headphones, and the like). For example, the settings of bass and treble levels, volume balance between speakers, and other features of the audio environment can either detract from or enhance the audio experience of the listener, depending on whether such features align with the personal audio preferences of the listener. Thus, when the audio environment conflicts with the personal audio preferences of a listener (too much bass, for example), that listener can have a poor audio experience, even though a favorite audio selection is being played.

Customization of discrete audio products, such as car audio systems, wireless headphones, home-entertainment systems, and the like, enables an audio environment to be aligned with personal audio preferences of the listener for that audio environment. For example, the performance of a sound system in a particular room may be optimized via room equalization, which can correct issues caused by the interaction of generated audio within the room itself and/or to additionally account for the audio preferences for the listener. In another example, a listener can set up equalization, volume, and other settings in an audio system in a vehicle so that the resultant audio environment is optimized for that listener in that vehicle. As a result, that particular listener has an optimal in-cabin listening experience tailored to the personal audio preferences of that listener and the acoustic characteristics of the audio environment.

One drawback to audio environment customization is that such customization is not generally intended for a current listener but is tied to a specific audio environment as customized by the last listener to do so. Therefore, when a new listener enters a room or uses a vehicle with an audio environment that has been customized by a previous listener, customizations set up by the previous listener are implemented by default. As a result, whenever a different listener enters an optimized audio environment, the customization process must be repeated, which can be time-consuming and frustrating for the new listener. Further, certain personal audio preferences can be impractical or impossible to obtain each time a user enters an optimized audio environment. For example, gain adjustment can be employed in an audio environment to compensate for a hearing deficiency profile of a particular listener, but performing a hearing test each time the listener re-customizes an audio environment is impractical at best. As a result, such gain adjustments generally cannot be implemented in an audio environment that is shared with other listeners nor conveniently applied to another audio environment.

In light of the above, more effective techniques for implementing customized audio processing in an audio environment would be useful.

SUMMARY

The various embodiments set forth a method for audio signal processing that includes accessing user-specific audio processing information for a particular user; determining identity information of an audio device for producing sound output from an audio signal; based on the identity information of the audio device, accessing device-specific audio processing information for the audio device; generating a customized audio-processing procedure for the audio signal based on the user-specific audio processing information and the device-specific audio processing information; and generating a customized audio signal by processing the audio signal with the customized audio-processing procedure.

At least one technical advantage of the disclosed techniques relative to the prior art is that the disclosed techniques enable a personalized audio experience for a listener irrespective of the current audio environment. Specifically, personal preferences of the listener and/or a hearing deficiency profile may be automatically applied to any audio environment while also accounting for the audio characteristics of the audio environment without the listener having to re-customize an audio system in each audio environment. A further advantage is that the personalized audio experience can be implemented in an audio environment that includes smart audio devices that perform some or all of the audio signal processing for producing the personalized audio experience or "dumb" audio devices that do not perform audio signal processing. These technical advantages represent one or more technological improvements over prior art approaches.

BRIEF DESCRIPTION OF THE SEVERAL VIEWS OF THE DRAWINGS

So that the manner in which the above recited features of the one or more embodiments can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of the various embodiments subsumes other embodiments as well.

For clarity, identical reference numbers have been used, where applicable, to designate identical elements that are common between figures. It is contemplated that features of one embodiment may be incorporated in other embodiments without further recitation.

DETAILED DESCRIPTION

Embodiments described herein provide a device-based and/or cloud-based personalized audio experience to a user in various audio environments, such as in a home, in a vehicle, and/or on the go (e.g., via headphones). The personalized audio experience is optimized for the listening preferences and hearing deficiencies of a particular user via personal sound and audio experience tailoring. As the user transitions from listening to audio content in one audio environment (e.g., via headphones) to another audio environment (e.g., via an in-vehicle audio system), the personal listening preferences and/or hearing impairment settings associated with the user are implemented in each audio environment. Thus, the embodiments generate an audio experience that is customized to a particular user and seamlessly follows that user from one audio environment to another. As a result, the audio experience of the user remains substantially the same even though different audio devices that are included in different audio environments are providing the audio content to the user. In various embodiments, a combination of mobile computing device, software application (or "app"), and/or cloud service delivers the personalized audio experience to multifarious devices and environments. One such embodiment is described below in conjunction with FIG. 1.

Figure 1:
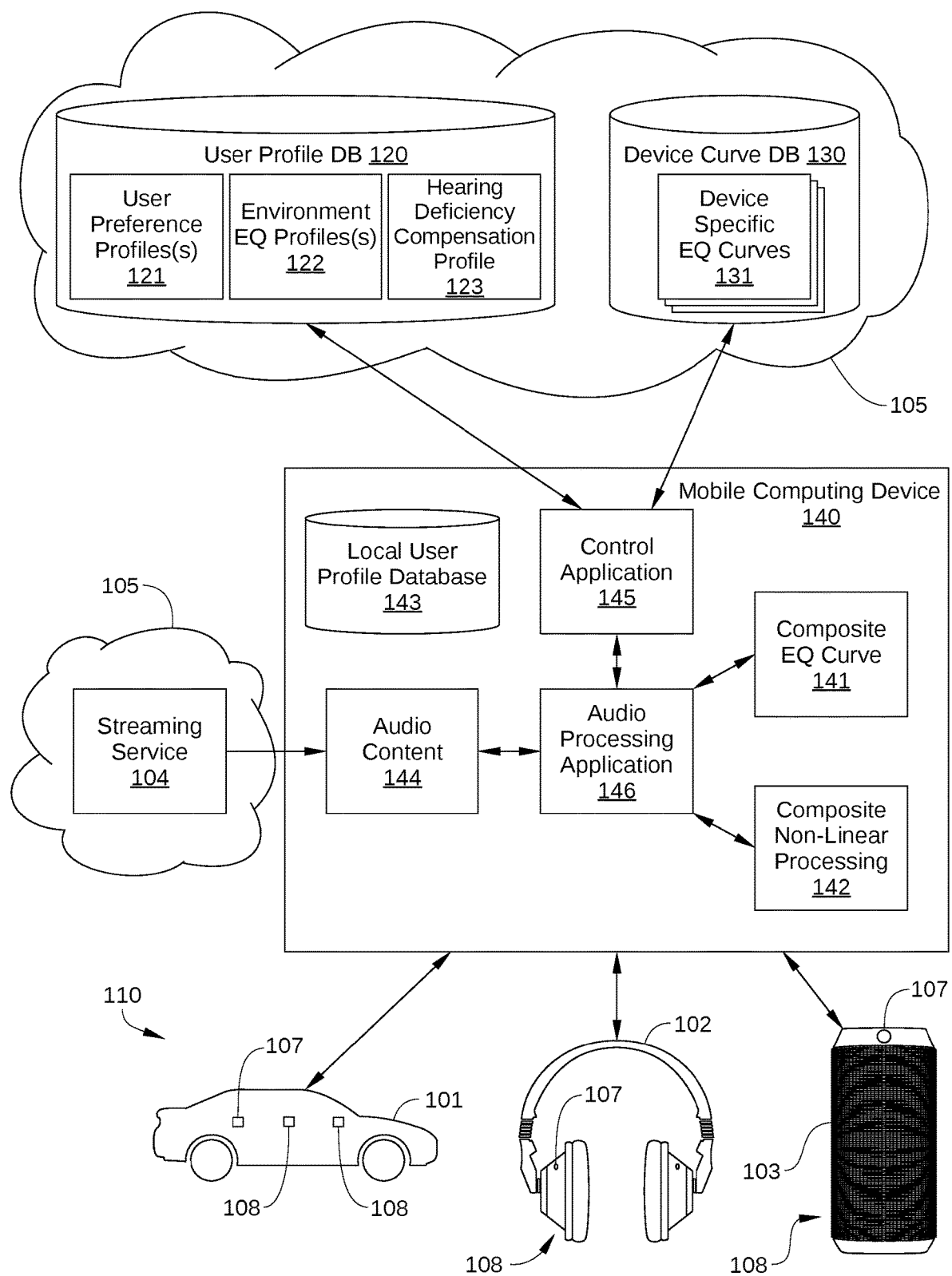
FIG. 1 is a schematic diagram illustrating a personalized audio system, configured to implement one or more aspects of the present disclosure.

FIG. 1 is a schematic diagram illustrating a personalized audio system 100, configured to implement one or more aspects of the present disclosure. Personalized audio system 100 includes, without limitation, one or more audio environments 110, a user profile database 120, a device profile database 130, and a mobile computing device 140. Personalized audio system 100 is configured to provide a personalized audio experience to a particular user irrespective of which specific audio environment 110 is currently providing the audio experience to the user. In some embodiments, audio content for the audio experience is stored locally in mobile computing device 140, and in other embodiments, such audio content is provided by a streaming service 104 that is implemented in a cloud infrastructure 105. Cloud infrastructure 105 can be any technically feasible Internet-based computing system, such as a distributed computing system and/or a cloud-based storage system.

Each of the one or more audio environments 110 is configured to play audio content for a particular user. For example, audio environments 110 may include, without limitation, one or more of an automotive (or other vehicle) audio environment 101, a headphone 102, and a smart speaker 103. In the embodiment illustrated in FIG. 1, audio environments 110 play audio content received from mobile computing device 140, for example via a wireless connection (e.g., Bluetooth® and/or WiFi®) and/or a wired connection. As a result, audio environments 110 can include any audio device that can receive audio content from mobile computing device 140 directly, such as a "dumb" speaker in a home, a stereo system in a vehicle, or a conventional pair of headphones. Further, in the embodiment illustrated in FIG. 1, audio environments 110 do not rely on the ability to perform audio signal processing internally or to receive audio content or other information from entities implemented in cloud-based infrastructure 105.

Each of the one or more audio environments 110 includes one or more speakers 107, and, in some embodiments, one or more sensors 108. Speaker(s) 107 are audio output devices configured to produce sound output based on a customized audio signal received from mobile computing device 140. Sensors(s) 108 are configured to acquire biometric data from the user (e.g., heartrate, skin conductance, and/or the like) and transmit signals associated with the biometric data to mobile computing device 140. The biometric data acquired by sensor(s) 108 can then be processed by a control algorithm 145 running on mobile computing device 140 to determine one or more personal audio preferences of a particular user. In various embodiments, sensor(s) 108 may include any type of image sensor, electrical sensor, biometric sensor, etc., that is capable of acquiring biometric data including, for example and without limitation, a camera, an electrode, a microphone, etc.

User profile database 120 stores user-specific and device-specific information that enables a similar personalized audio experience to be produced in any of audio environments 110 for a particular user. As shown, user profile database 120 is implemented in cloud-based infrastructure 105, and therefore is available to be accessed by mobile computing device 140 whenever mobile computing device 140 has Internet connectivity. Such Internet connectivity can be via a cellular connection, a WiFi® connection, and/or a wired connection. The user-specific and device-specific information stored in user profile database 120 can include one or more of user preference equalization (EQ) profile(s) 121, environment equalization (EQ) profile(s) 122, and hearing deficiency compensation profile 123. In some embodiments, information that is associated with a particular user and stored in user profile database 120 is also stored locally in a mobile computing device 140 that is associated with that particular user. In such embodiments, user preference profile(s) 121, environment EQ profile(s) 122, and/or hearing deficiency compensation profile 123 are stored in a local user profile database 143 of mobile computing device 140.

User preference profile(s) 121 include user-specific information that is employed to produce a personalized audio experience in any of audio environments 110 for a particular user. In some embodiments, user preference profile(s) 121 include acoustic filters and/or EQ curves that are associated with the particular user. Generally, when employed as part of a customized audio-processing procedure for the audio signal by an audio processing application 146 of mobile computing device 140, an acoustic filter or EQ curve adjusts the amplitude of an audio signal at particular frequencies. Thus, audio content selected by a particular user and played back in one of audio environments 110 is modified to suit the personal listening preferences of that user. Alternatively or additionally, in some embodiments, user preference profile(s) 121 include other user-preferred signal processing, such as dynamic range compression, dynamic expansion, audio limiting, and/or spatial processing of an audio signal. In such embodiments, when selected by the user, such user-preferred signal processing can also be employed by audio processing application 146 to modify audio content when played back in one of audio environments 110.

In some embodiments, user preference profile(s) 121 include one or more user preference-based EQ curves that reflect audio equalization that is preferred by the particular user associated with user profile database 120. In such embodiments, a user preference-based EQ curve can be a preset EQ curve selected during setup of preferred listening settings by the user. Alternatively or additionally, in such embodiments, a user preference-based EQ curve can be a preset EQ curve that is associated with a different user, such a preference-based EQ curve associated with a well-known musician or celebrity. Alternatively or additionally, in such embodiments, a user preference-based EQ curve can be an EQ curve that includes one or more discrete amplitude adjustments performed by the user during setup of preferred listening settings by the user. Alternatively or additionally, in such embodiments, a user preference-based EQ curve can include head-related transfer function (HRTF) information specific to the particular user. Such a user preference-based EQ curve can enable an immersive and/or three-dimensional audio experience for the particular user associated with that user preference EQ curve when employed by audio processing application 146 as part of a customized audio-processing procedure.

In some embodiments, each user preference profile 121 can be associated with the playback of a specific category or categories of music, a specific time or times of day, a specific set of biometric feedback (which can be indicative of mood) received from the user via one or more sensors 108, and the like. Thus, for the same user, different user preference profiles 121 can be employed to produce a different personalized audio environment. For example, based on a user selection via a user interface of mobile computing device 140, a different user preference EQ curve can be employed to produce the personalized audio environment for the user.

Environment EQ profile(s) 122 include location-specific information that is employed to produce a personalized audio experience in any of audio environments 110 for a particular user. In some embodiments, environment EQ profile(s) 122 include acoustic filters and/or EQ curves that are each configured for a specific audio environment 110 and/or a specific location within a specific audio environment 110.

In some embodiments, one of environment EQ profiles 122 is configured to provide EQ compensation for issues caused by the interaction of sound generated within a specific audio environment 110 and/or surfaces in the audio environment 110. For example, an audio experience for the user can be improved for a specific seat position in a vehicle or location within a room when such an environment EQ profile 122 is employed as part of a customized audio-processing procedure by audio processing application 146. For a fixed environment, such as a specific vehicle interior with known loudspeaker types and locations, such an environment EQ profile 122 can be determined without user interaction and is provided as an option to the user as a preset seat correction EQ. Alternatively or additionally, such a preset environment EQ profile 122 can be further modified by the user during a user sound preference test or a setup operation for personalized audio system 100. For other environments, such as a particular location within a particular room, an environment EQ profile 122 can be determined via a test based on user interaction, such as a user sound preference test that is performed in the particular location within the particular room via a speaker 107 (e.g., smart speaker 103), a sensor 108, and mobile computing device 140. In some embodiments, the user sound preference test can be performed via control application 145, audio processing application 146, or any other suitable software application running on mobile computing device 140.

Hearing deficiency compensation profile 123 includes user-specific information that can be employed to compensate for hearing deficiency associated with a particular user. According to various embodiments, such hearing deficiency compensation can be a component of the personalized audio experience for the user associated with user profile database 120. Generally, hearing deficiency compensation profile 123 includes one or more gain compression curves that are selected to compensate for hearing deficiencies detected in or otherwise associated with the user associated with user profile database 120. In some embodiments, such gain compression curves can enable multi-band compression, in which different portions of the frequency spectrum of an audio signal undergo different levels of gain compression. Gain compression can increase low-level sounds that are below a threshold level without causing higher-level sounds to become uncomfortably loud. Consequently, gain compression is employed to compensate for hearing deficiencies of a particular user, and such gain compression is implemented via the one or more gain compression curves that are included in hearing deficiency compensation profile 123.

In some embodiments, the hearing deficiencies of a particular user are determined based on demographic information collected from the user, for example via a questionnaire delivered to the user via a suitable software application running on mobile computing device 140. In such embodiments, the questionnaire can be delivered to the user during a setup operation for personalized audio system 100. In other embodiments, such hearing deficiencies are determined based on one or more hearing tests performed via one or more speakers 107, one or more sensors 108, and mobile computing device 140. In either case, hearing deficiencies in certain frequency bands are determined, and suitable hearing deficiency compensation profile 123 is selected, based on such hearing deficiencies. For example, a specific gain compression curve can be selected or constructed for the user, based on demographic information and/or hearing test information collected from the user. The specific gain compression curve is then included in hearing deficiency compensation profile 123 for that user, and can be employed by audio processing application 146 as part of a customized audio-processing procedure to produce a personalized audio experience for the user. As a result, a personalized audio experience that includes hearing compensation can be provided to the user in any of audio environments 110.

Figure 2:
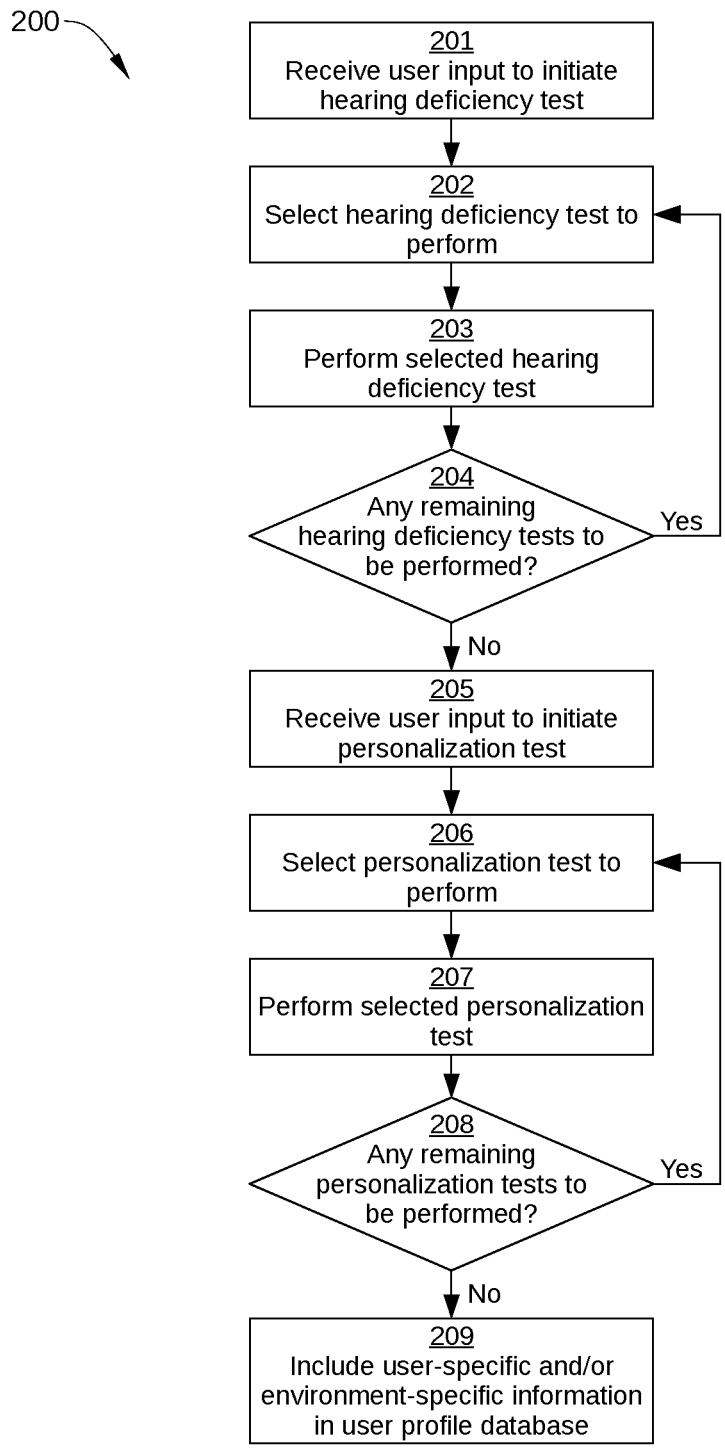
FIG. 2 is a flowchart of method steps for generating user-specific information for personalizing an audio experience, according to various embodiments of the present disclosure.

FIG. 2 is a flowchart of method steps for generating user-specific information for personalizing an audio experience, according to various embodiments of the present disclosure. The user-specific information generated by the method steps can include one or more user preference profiles 121, environment EQ profiles 122, and/or hearing deficiency compensation profile 123. Although the method steps are described with respect to the system of FIG. 1, persons skilled in the art will understand that any system configured to perform the method steps, in any order, falls within the scope of the various embodiments.

As shown, a method 200 begins at step 201, in which a suitable software application running on mobile computing device 140, such as control application 145, receives a user input to initiate a hearing deficiency test of the current user.

In step 202, the software application selects a specific hearing deficiency test to perform. Each such hearing deficiency test can determine hearing deficiency compensation information associated with the user. For example, in some embodiments, certain hearing deficiency tests can be specific to a different audio environment 110 and/or to a specific user. Thus, in such embodiments, a different hearing deficiency test can be selected for a user depending on the current audio environment 110. Further, in some embodiments, different types of hearing deficiency tests can be selected, such as a hearing deficiency test based on demographic information and a hearing deficiency test based on quantifying hearing loss in multiple frequency bands.

In step 203, the software application performs the hearing deficiency test selected in step 202. For example, in some instances, demographic user information may be collected to determine what hearing deficiency compensation is likely beneficial for the user. Alternatively or additionally, in some embodiments, a hearing deficiency test is performed via the software application, one or more speakers 107 disposed in the current audio environment 110, and one or more sensors 108 disposed in the current audio environment 110. In such embodiments, hearing deficiencies of the user can be quantified for each of a plurality of frequency bands, and the results of such testing is included in hearing deficiency compensation profile 123 for the user.

In step 204, the software application determines whether there are any remaining hearing deficiency tests to be performed for the user in the current audio environment 110. For example, in some embodiments, the software application prompts the user with a list of hearing deficiency tests that have not yet been performed by the user. If yes, method 200 returns back to step 202 and another hearing deficiency test to be performed is selected; if no, method 200 proceeds to step 205.

In step 205, the software application receives a user input to initiate a personalization test of the current user and/or audio environment 110.

In step 206, the software application selects a specific personalization test to perform. For example, in some embodiments, possible personalization tests include, without limitation, a personal EQ preference test to determine a specific user preference profile 121 for the user, an environmental EQ test to determine a specific environment EQ profile 122 for a particular audio environment 110 specified by the user, and an HRTF test to determine a specific HRTF for the user.

In step 207, the software application performs the personalization test selected in step 206. For example, in an instance in which a personal EQ preference test is performed, preset acoustic filters or other acoustic profiles may be demonstrated to the user via the current audio environment 110, so that the user can select the preset acoustic profile that provides the best audio experience. During such personalization testing, the software application may display an acoustic preset ranking screen that includes one or more preset acoustic filter responses. The user can then listen to a test sound that is sequentially processed by each of the preset acoustic filter responses and rank the preset acoustic filter responses based on personal preference. In some embodiments, the preset acoustic filters so employed are based on data related to the user. For example, the software application may retrieve historical data related to demographic data associated with or entered by the user to select one or more preset acoustic filters that users within the demographic range have previously ranked highly. Alternatively or additionally, in some embodiments, such personalization testing includes "optometry test" style testing, which relies on A/B choices being made by a user. Such optometry test style testing can quickly narrow to a selection based on A/B comparison listening tests. Alternatively or additionally, in some embodiments, such personalization testing provides discrete editing of specific frequency band levels of a selected preset acoustic filter response.

In an instance in which an environmental EQ test is performed, preset acoustic filters may be demonstrated to the user via the current audio environment 110, so that the user can select the preset acoustic filter that have been ranked highly to provide the best audio experience for the specific audio environment 110 indicated by the user. During such personalization testing, the software application may display an acoustic preset ranking screen that includes one or more preset acoustic filter responses, and also perform sequential or A/B testing of the different preset acoustic filters. Alternatively or additionally, in some embodiments, such environmental EQ testing enables the user to perform discrete editing of specific frequency band levels of a selected preset acoustic filter response. For example, in some embodiments a different slider is displayed for selecting a desired gain for each frequency band.

In an instance in which an HRTF test is performed, specific HRTF values for the user are determined based on characteristics of the user that affect localization of sound in the audio environment 110, such as anthropometric features of the user. The specific HRTF values for the user are then included in user profile database 120 as a user preference profile 121 that can be employed for processing an audio signal. When the audio output based on the HRTF-processed audio signal is played in the audio environment 110, the hearing of the user generally interprets the audio output as coming from all directions, rather than from discrete audio devices disposed within the audio environment 110.

In step 208, the software application determines whether there are any remaining personalization tests to be performed for the user in the current audio environment 110. For example, in some embodiments, the software application prompts the user with a list of personalization tests that have not yet been performed by the user. If yes, method 200 returns back to step 206 and another personalization test to be performed is selected; if no, method 200 proceeds to step 209.

In step 209, the software application includes the user-specific and/or environment-specific information determined via the above-described personalization testing in user profile database 120.

Returning to FIG. 1, device profile database 130 includes a plurality of device-specific EQ curves 131 that are each associated with a particular audio device, such as a specific make and model of headphone, in-vehicle audio system, make and model of smart speaker, etc. Further, each device-specific EQ curve 131 is configured to modify an audio signal before being played back by the associated audio device, where the audio signal is modified to compensate for the non-ideal frequency response of that audio device. In some embodiments, an ideal audio system generates audio output with little or no distortion of the input signal on which the audio output is based. That is, the ideal audio system behaves with a uniform, flat magnitude of frequency response across the operating frequencies of the system (e.g., 20 Hz to 20 kHz). In addition, in an ideal audio system, the audio output is delayed by precisely the same amount of time at all operating frequencies of the system. In practice, any given audio system has a different frequency response that varies from the above-described frequency response of an ideal audio system. Furthermore, many speakers have a rough, non-flat frequency response that includes peaks and dips at certain frequencies and/or overemphasizes responses at certain frequencies. Generally, speakers with a non-flat frequency response generate audio output with added resonances or colorations that are audible to and universally disliked by most users. Consequently, even though great effort and resources have been directed to capturing a particular musical performance with a high-quality recording, the frequency response of the playback device can significantly degrade the user experience when listening to the recording.

In some embodiments, each device-specific EQ curve 131 is constructed via benchmarking or other performance-quantifying testing of a particular audio device, such as a set of headphones, a smart speaker, the speakers of an in-vehicle audio system, a conventional speaker, and the like. Device-specific EQ curves 131 are then stored in device profile database 130 and made available to audio processing application 146 of mobile computing device 140. Thus, according to various embodiments, when a specific audio device is detected by audio processing application 146, the appropriate device-specific EQ curve 131 can be incorporated into a customized audio-processing procedure for an audio signal by an audio processing application 146. As a result, the personalized audio experience that is generated from an audio signal for a particular user via the customized audio-processing procedure can include compensation for the non-ideal frequency response of the audio device providing the personalized audio experience.

Mobile computing device 140 can be any mobile computing device that can be configured to implement at least one aspect of the present disclosure described herein, including a smartphone, an electronic tablet, a laptop computer, and the like. Generally, mobile computing device 140 can be any type of device capable of executing application programs including, without limitation, instructions associated with control application 145 and/or audio processing application 146. In some embodiments, mobile computing device 140 is further configured to store local user profile database 143, which can include one or more of user preference profiles 121, environment EQ profile(s) 122, and/or hearing deficiency compensation profile 123. Alternatively or additionally, in some embodiments, mobile computing device 140 is further configured to store audio content 144, such as digital recordings of audio content.

Control application 145 is configured to perform communications between mobile computing device 140 and user profile database 120, device profile database 130, and audio environments 110. In some embodiments, control application 145 is also configured to present a user interface (not shown) to a user to enable a user sound preference test, a hearing test, and/or a setup operation for personalized audio system 100. In some embodiments, control application 145 is further configured to generate a customized audio-processing procedure for an audio signal based on user-specific audio processing information and device-specific audio processing information. For example, the user-specific audio processing information can include one or more user preference profiles 121 and/or hearing deficiency compensation profile 123, while the device-specific audio processing information can include one or more environment EQ profiles 122 and/or device-specific EQ curves 131.

In some embodiments, control application 145 generates the customized audio-processing procedure by generating a composite EQ curve 141 and/or a composite gain curve 142 for one or more particular listening scenarios. Generally, each particular listening scenario is a unique combination of user and listening environment 110. Thus, for a particular user, control application 145 is configured to generate a different composite EQ curve 141 and/or composite non-linear processing 142 for each listening environment 110 in which a user is expected to have a personalized audio experience. For example, when the user is in a specific automotive audio environment 101 (such as a particular seat in a particular make and model of vehicle), control application 145 generates a composite EQ curve 141 based on some or all applicable EQ curves. In such an instance, example of applicable EQ curves include, without limitation, one or more applicable user preference profiles 121 associated with the user, the environment EQ profile(s) 122 that are applicable to the specific automotive audio environment 101 in which the user is located, device-specific EQ curve(s) 131 that are applicable to the specific automotive audio environment 101, hearing deficiency compensation profile 123.

In some embodiments, control application 145 generates a composite EQ curve 141 for a particular listening scenario by summing the operations of all applicable EQ profiles into a single sound equalization curve. Thus, in a customized audio-processing procedure performed by audio processing application 146, an audio signal can be modified with composite EQ curve 141 instead of being sequentially processed with multiple EQ profiles. In some embodiments, control application 145 also generates composite non-linear processing 142 for the particular listening scenario by summing the operations of all applicable non-linear processing portions of user preference profiles 121 and/or hearing deficiency compensation profile 123 into a single composite non-linear processing 142. For example, such non-linear processing can include, without limitation, one or more gain compression operations included in hearing deficiency compensation profile 123, one or more dynamic range compression operations included in user preference profiles 121, one or more audio limiting operations included in user preference profiles 121, and the like.

In some embodiments, when control application 145 generates a composite EQ curve 141 for a particular listening scenario, the composite EQ curve is stored in local user profile database 143 and/or in user profile database 120 for future use. Similarly, in such embodiments, when control application 145 generates a composite non-linear processing 142 for the particular listening scenario, the composite non-linear processing 142 is also stored in local user profile database 143 and/or in user profile database 120 for future use.

In some embodiments, each particular listening scenario is a unique combination of user, listening environment 110, and a user-selected user preference profile 121 from user profile database 120. In such embodiments, the user-selected user preference profile 121 can be an EQ curve associated with a well-known musician or celebrity, an EQ curve the user has associated with a particular activity (e.g., playing a video game, exercising, driving, etc.), an EQ curve the user has associated with a particular category of music or play list, and the like. Thus, in such an embodiment, control application 145 is configured to generate a different composite EQ curve 141 for a particular combination of user, listening environment 110, and a user-selected user preference profile 121. Thus, through the selection of a suitable user preference profile 121, the user can tailor a personalized audio experience to both a particular audio environment 110 and user preference profile 121.

Audio processing application 146 is configured to generate a customized audio signal by processing an initial audio signal with the customized audio-processing procedure generated by control application 146. More specifically, audio processing application 146 generates the customized audio signal by modifying the initial audio signal with a composite EQ curve 141 and, in some embodiments, a composite non-linear processing 142. One such embodiment is described below in conjunction with FIG. 3.

Figure 3:
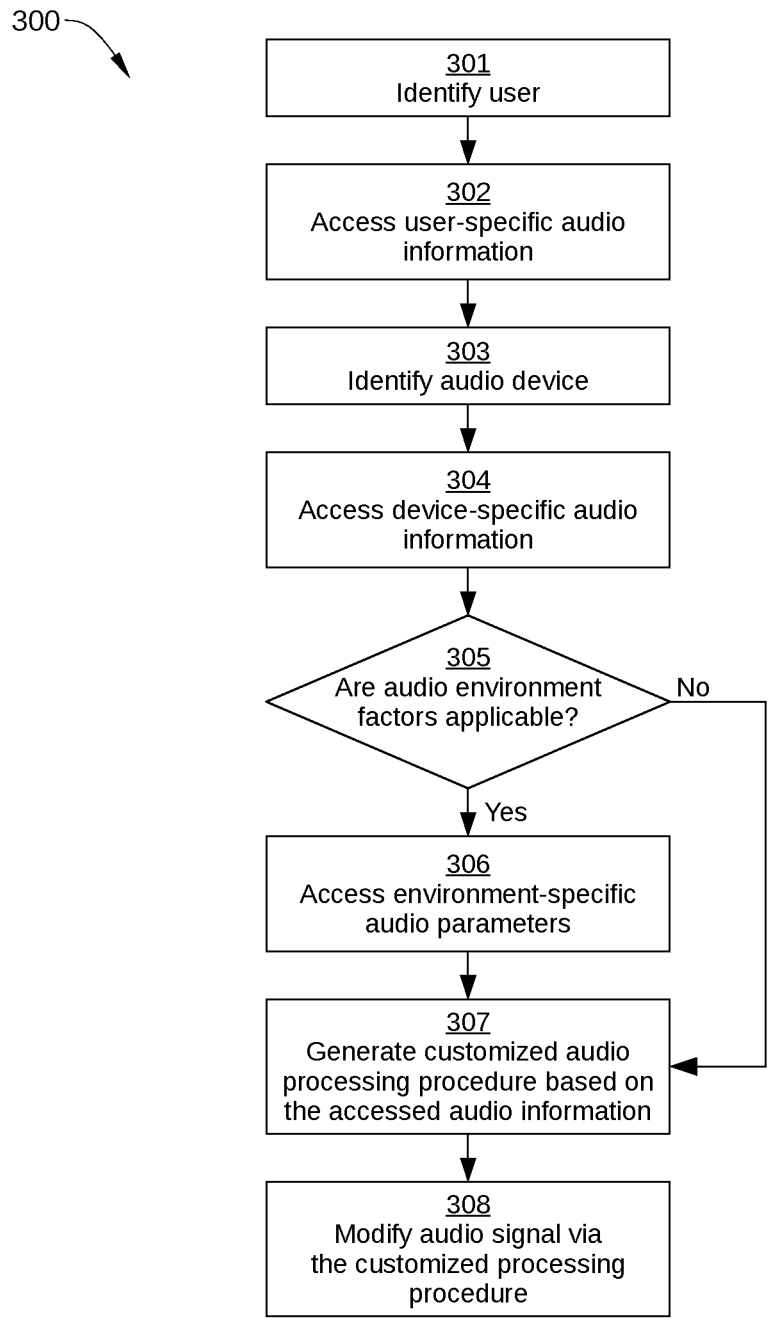
FIG. 3 is a flowchart of method steps for generating a customized audio signal, according to various embodiments of the present disclosure.

FIG. 3 is a flowchart of method steps for generating a customized audio signal, according to various embodiments of the present disclosure. Although the method steps are described with respect to the system of FIGS. 1 and 2, persons skilled in the art will understand that any system configured to perform the method steps, in any order, falls within the scope of the various embodiments.

As shown, a method 300 begins at step 301, in which audio processing application 146 identifies the current user. For example, audio processing application 146 can determine identity information of the user based on a user login, user information entered by the user, etc.

In step 302, audio processing application 146 accesses user-specific audio information, such one or more user preference EQ curves 151, hearing deficiency compensation profile 123, and/or other user-specific listening processing information that enable a customized audio-processing procedure to generate a personalized audio experience for the user. In some embodiments, audio processing application 146 accesses some or all of the user-specific audio information in user profile database 120. Alternatively or additionally, in some embodiments audio processing application 146 accesses some or all of the user-specific audio information in local user profile database 143.

In step 303, audio processing application 146 identifies the audio device or device(s) included in the current audio environment. For example, in some embodiments, control application 145 determines identifying information for the audio device(s) of the current audio environment 110 based on information input by the user and communicates the identifying information to audio processing application 146. In other embodiments, control application 145 determines or receives identifying information for the audio device(s) by querying each audio device directly. For example, in one such embodiment, control application 145 receives a media access control (MAC) address, model number, and/or the like via a wireless connection with an audio device.

In step 304, audio processing application 146 accesses device-specific audio information (such as one or more device-specific EQ curves 131) that enables a customized audio-processing procedure to generate a personalized audio experience for the user. In some embodiments, audio processing application 146 accesses some or all of the device-specific audio information in user profile database 120, and in some embodiments audio processing application 146 accesses some or all of the device-specific audio information in local user profile database 143.

In step 305, audio processing application 146 determines whether audio environment-specific audio processing information is applicable. For example, based on identifying information for the audio device(s) determined in step 303, control application 145 can determine that the current audio environment 110 includes an audio system associated with a particular vehicle interior or a smart speaker that has been associated with a specific room or other location for which the user has performed an environmental EQ test. If no, method 300 proceeds to step 307; if yes, method 300 proceeds to step 306.

In step 306, audio processing application 146 accesses environment-specific audio information (e.g., such as one or more environment-specific EQ profiles 122) that enables a customized audio-processing procedure to generate a personalized audio experience for the user. In some embodiments, audio processing application 146 accesses some or all of the environment-specific audio information in user profile database 120, and in some embodiments audio processing application 146 accesses some or all of the environment-specific audio information in local user profile database 143.

In step 307, audio processing application 146 generates a customized audio processing procedure based on the audio information accessed in steps 302, 304, and 306. Specifically, audio processing application 146 generates the customized audio-processing procedure by generating a composite EQ curve 141 and/or a composite non-linear processing 142 for current listening scenario. As noted above, the current listening scenario can be based on a combination of the current user, the current listening environment 110, and, in some embodiments, a user preference profile 121 selected by the user and/or hearing deficiency compensation profile 123.

In step 308, audio processing application 146 modifies an audio signal via the customized audio processing procedure generated in step 307. In some embodiments, the audio signal is generated from audio content 144 stored locally in mobile computing device 140. In other embodiments, the audio signal is generated from audio content received from streaming service 104.

According to various embodiments, modification of the audio signal via the customized audio processing procedure occurs in two stages. First, the audio signal is processed using the composite EQ curve 141 to generate a modified audio signal. A gain-modifying operation is then performed on the modified audio signal to generate a customized audio signal that, when played in the appropriate audio environment 110, produces a personalized audio experience for the user. It is noted that the multiple equalization or filtering operations that are combined to form composite EQ curve 141 are not performed serially on the audio signal, and instead are performed in a single operation. As a result, noise levels in the audio signal are not increased, which can occur when one EQ operation reduces the level in a particular frequency band and a subsequent EQ operation amplifies the level in that frequency band. Similarly, clipping can also be prevented or reduced, because clipping may occur when one EQ operation amplifies the level of an audio signal in a particular frequency band beyond a threshold limit and a subsequent EQ operation reduces the level of that frequency band.

In the embodiment illustrated in FIG. 1, a combination of mobile computing device 140, one or more software applications running on mobile computing device 140, and a cloud-based service delivers the personalized audio experience to various audio environments 110. In other embodiments, one or more audio devices in various audio environments communicate directly with the cloud-based service to enable the personalized audio experience in each of the various audio environments. In such embodiments, a mobile computing device can provide a user interface and/or audio system control interface, but does not operate as a processing engine for generating and/or implementing a customized audio-processing procedure for an audio signal. Instead, some or all of the customized audio-processing procedure is performed in the cloud-based service and some or all of the audio processing using the customized audio-processing procedure is performed locally in a smart device included in the audio environment. One such embodiment is described below in conjunction with FIG. 4.

Figure 4:
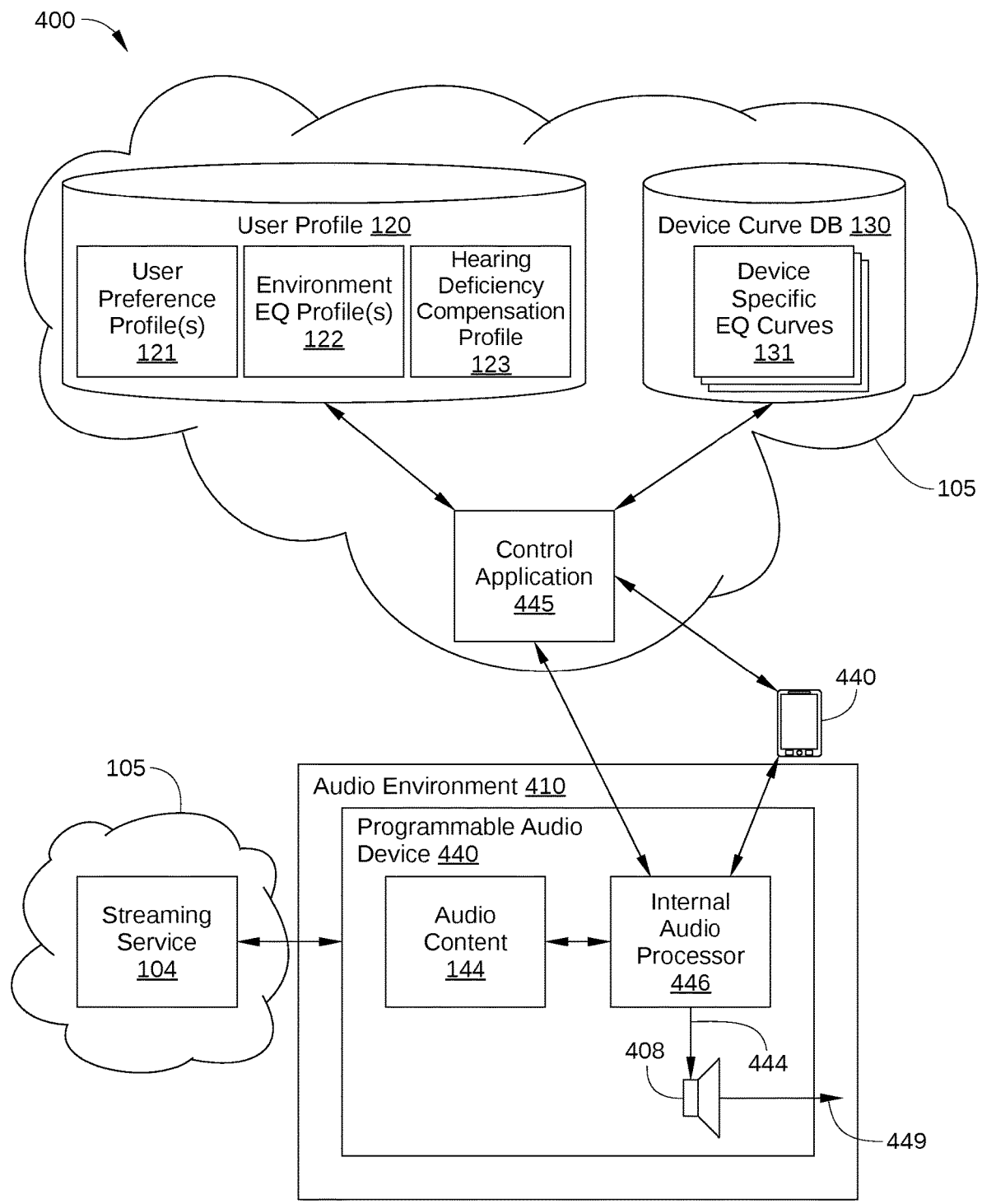
FIG. 4 is a schematic diagram illustrating a personalized audio system, according to various embodiments of the present disclosure.

FIG. 4 is a schematic diagram illustrating a personalized audio system 400, configured to implement one or more aspects of the present disclosure. Personalized audio system 400 includes, without limitation, one or more audio environments 410 that includes at least one programmable audio device 440, user profile database 120, device profile database 130, and a mobile computing device 440. Personalized audio system 400 is configured to provide a personalized audio experience to a particular user irrespective of what specific audio environment 410 is currently providing the audio experience to the user. Personalized audio system 400 is similar in operation to personalized audio system 100, except that a control application 445 that is running in cloud infrastructure 105 generates a customized audio-processing procedure for modifying an audio signal for playback in a particular audio environment. Further, audio signal processing using the customized audio-processing procedure is performed in one or more programmable audio devices 440 associated with a specific audio environment. Thus, control application 445 generates a composite EQ curve similar to composite EQ curve 141 of FIG. 1 and/or a composite gain curve similar to composite non-linear processing 142 of FIG. 1.

In some embodiments, a customized audio-processing procedure is implemented in personalized audio system 400 by being programmed into internal audio processor 446 of programmable audio device 440. In such embodiments, audio processing associated with the customized audio-processing procedure is performed by internal audio processor 446, which can be a programmable digital signal processor (DSP) or other processor. An audio signal (for example from streaming service 104 or based on audio content 144) is modified by internal audio processor 446 using the customized audio-processing procedure to generate a customized audio signal 444. When a speaker 408 included in or otherwise associated with programmable audio device 440 produces sound output 449 that is based on the customized audio signal 444, a personalized audio experience is generated for the user in audio environment 410. Thus, in the embodiment illustrated in FIG. 4, an audio signal (for example from streaming service 104 or based on audio content 144) is processed with the customized audio-processing procedure by internal audio processor 445, rather than by a processor external to an audio device included in audio environment 410.

Figure 5:
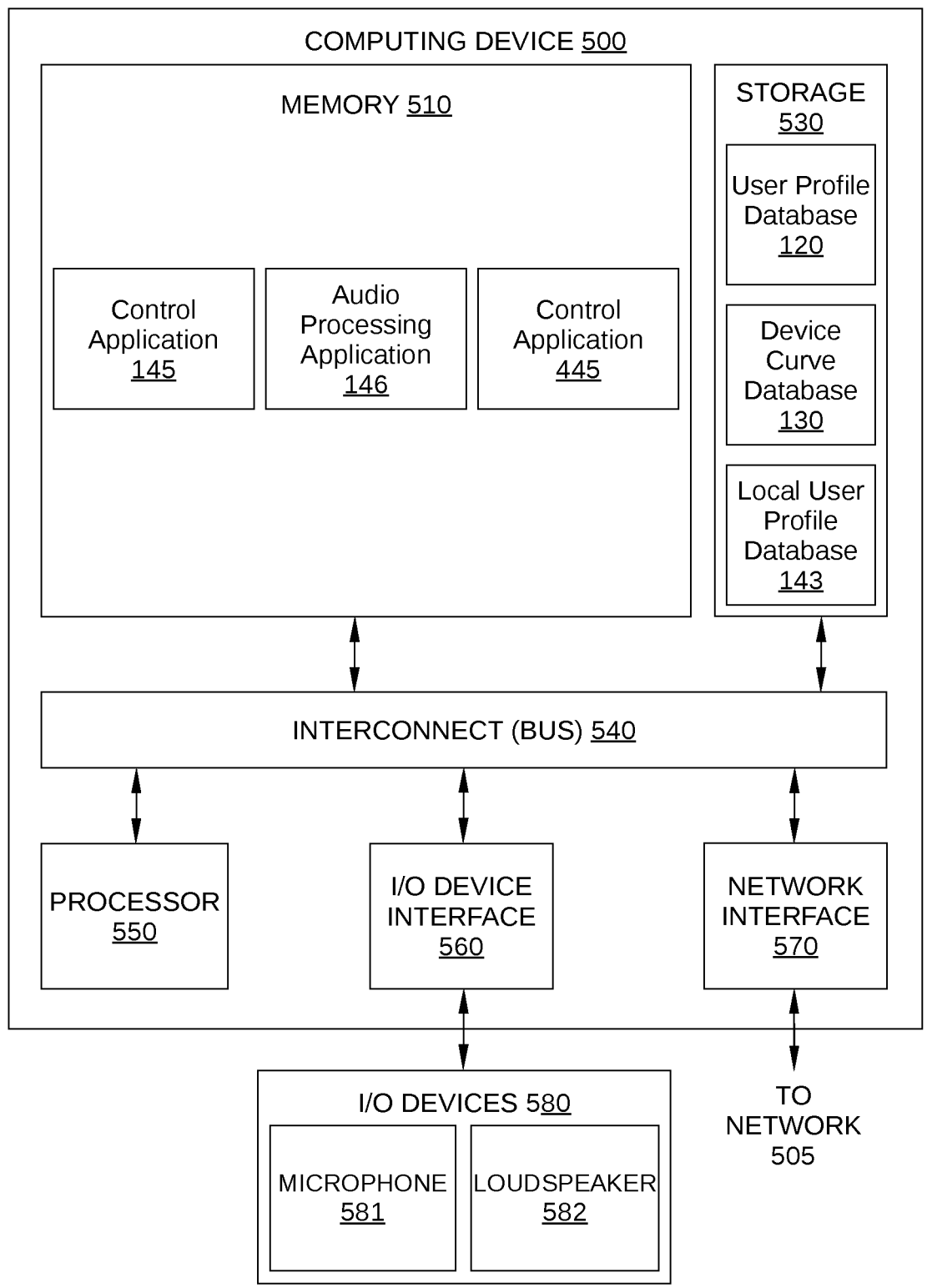
FIG. 5 is a conceptual block diagram of a computing system configured to implement one or more aspects of the various embodiments.

FIG. 5 is a conceptual block diagram of a computing system 500 configured to implement one or more aspects of the various embodiments. Computing system 500 may be any type of device capable of executing application programs including, without limitation, instructions associated with control application 145, audio processing application 146, and/or control application 445. For example, and without limitation, computing system 500 may be an electronic tablet, a smartphone, a laptop computer, an infotainment system incorporated into a vehicle, a home entertainment system, etc. Alternatively, computing system 500 may be implemented as a stand-alone chip, such as a microprocessor, or as part of a more comprehensive solution that is implemented as an application-specific integrated circuit (ASIC), a system-on-a-chip (SoC), and so forth. It is noted that the computing system described herein is illustrative and that any other technically feasible configurations fall within the scope of the present invention.

As shown, computing system 500 includes, without limitation, an interconnect (bus) 540 that connects a processor 550, an input/output (I/O) device interface 560 coupled to I/O devices 580, memory 510, a storage 530, and a network interface 570. Processor 550 may be any suitable processor implemented as a central processing unit (CPU), an application-specific integrated circuit (ASIC), a field programmable gate array (FPGA), any other type of processing unit, or a combination of different processing units, such as a CPU configured to operate in conjunction with a digital signal processor (DSP). For example, in some embodiments, processor 550 includes a CPU and a DSP. In general, processor 550 may be any technically feasible hardware unit capable of processing data and/or executing instructions to facilitate operation of computing system 500 of FIG. 5, as described herein. Further, in the context of this disclosure, the computing elements shown in computing device 500 may correspond to a physical computing system (e.g., a system in a data center) or may be a virtual computing instance executing within a computing cloud.

I/O devices 580 may include devices capable of providing input, such as a keyboard, a mouse, a touch-sensitive screen, a microphone 581 and so forth, as well as devices capable of providing output, such as a loudspeaker 582 and a display screen. The display screen may be a computer monitor, a video display screen, a display apparatus incorporated into a hand held device, or any other technically feasible display screen. Particular instances of loudspeaker 582 can include one or more loudspeakers that are elements of an audio system, such as personalized audio system 100 in FIG. 1 or personalized audio system 400 in FIG. 4.

I/O devices 580 may include additional devices capable of both receiving input and providing output, such as a touch-screen, a universal serial bus (USB) port, and so forth. Such I/O devices 580 may be configured to receive various types of input from an end-user of computing device 500, and also to provide various types of output to the end-user of computing device 500, such as displayed digital images or digital videos. In some embodiments, one or more of I/O devices 580 are configured to couple computing device 500 to communications network 505.

I/O interface 560 enables communication of I/O devices 580 with processor 550. I/O interface generally includes the requisite logic for interpreting addresses corresponding to I/O devices 580 that are generated by processor 550. I/O interface 560 may also be configured to implement handshaking between processor 550 and I/O devices 580, and/or generate interrupts associated with I/O devices 580. I/O interface 560 may be implemented as any technically feasible CPU, ASIC, FPGA, any other type of processing unit or device.

Network interface 570 is a computer hardware component that connects processor 550 to communication network 505. Network interface 570 may be implemented in computing device 500 as a stand-alone card, processor, or other hardware device. In embodiments in which communication network 505 includes a WiFi® network or a WPAN, network interface 570 includes a suitable wireless transceiver. Alternatively or additionally, network interface 570 may be configured with cellular communication capability, satellite telephone communication capability, a wireless WAN communication capability, or other types of communication capabilities that allow for communication with communication network 505 and other computing devices 500 external to computing system 500.

Memory 510 may include a random access memory (RAM) module, a flash memory unit, or any other type of memory unit or combination thereof. Processor 550, I/O device interface 560, and network interface 570 are configured to read data from and write data to memory 510. Memory 510 includes various software programs that can be executed by processor 550 and application data associated with said software programs, including control application 145, audio processing application 146, and/or control application 445.

Storage 530 can include a non-transitory computer-readable medium, such as a non-volatile storage device. In some embodiments, storage 530 includes user profile database 120, device profile database 130, and/or local user profile database 143.

In sum, various embodiments set forth systems and techniques for providing a device-based and/or cloud-based personalized audio experience to a user in various audio environments, where the personalized audio experience is optimized for the listening preferences and hearing deficiencies of a particular user via personal sound and audio experience tailoring. In the embodiments, a customized audio-processing procedure is generated that is based on user-specific, audio device-specific, and environment-specific information. When the customized audio-processing procedure is employed to modify an audio signal prior to playback, the user can have a personalized audio experience tailored to the listening preferences of the user.

At least one technical advantage of the disclosed techniques relative to the prior art is that the disclosed techniques enable a personalized audio experience for a listener irrespective of the current audio environment. Specifically, personal preferences of the listener and/or a hearing deficiency profile may be automatically applied to any audio environment while also accounting for the audio characteristics of the audio environment without the listener having to re-customize an audio system in each audio environment. A further advantage is that the personalized audio experience can be implemented in an audio environment that includes smart audio devices that perform some or all of the audio signal processing for producing the personalized audio experience or "dumb" audio devices that do not perform audio signal processing. These technical advantages represent one or more technological improvements over prior art approaches.

1. In some embodiments, a method of audio signal processing comprises: accessing user-specific audio processing information for a particular user; determining identity information of an audio device for producing sound output from an audio signal; based on the identity information of the audio device, accessing device-specific audio processing information for the audio device; generating a customized audio-processing procedure for the audio signal based on the user-specific audio processing information and the device-specific audio processing information; and generating a customized audio signal by processing the audio signal with the customized audio-processing procedure.

2. The method of clause 1, further comprising, causing the audio device to produce sound output from the customized audio signal.

3. The method of clauses 1 or 2, wherein causing the audio device to produce sound output from the customized audio signal comprises transmitting the customized audio signal to the audio device via a wireless connection.

4. The method of any of clauses 1-3, wherein the processing the audio signal with the customized audio-processing procedure is performed via a processor external to the audio device.

5. The method of any of clauses 1-4, wherein the processing the audio signal with the customized audio-processing procedure is performed via a processor included in the audio device.

6. The method of any of clauses 1-5, wherein accessing user-specific audio processing information for the particular user comprises: determining identity information of the particular user; and based on the identity information of the particular user, retrieving the user-specific audio processing information from a cloud-based repository.

7. The method of any of clauses 1-6, wherein accessing user-specific audio processing information for the particular user comprises: determining identity information of the particular user; and based on the identity information of the particular user, retrieving the user-specific audio processing information from a computing device configured for generating the customized audio-processing procedure.

8. The method of any of clauses 1-7, wherein generating the customized audio processing procedure comprises generating a composite sound equalization curve from information included in at least one of the user-specific audio processing information or the device-specific audio processing information.

9. The method of any of clauses 1-8, wherein generating the composite sound equalization curve comprises combining all sound equalization curves included in the user-specific audio processing information or the device-specific audio processing information.

10. The method of any of clauses 1-9, wherein generating the customized audio signal with the customized audio-processing procedure comprises: generating a modified audio signal by modifying the audio signal with the composite sound equalization curve; and performing a gain-modifying operation indicated in at least one of the user-specific audio information or the device-specific audio information on the modified audio signal.

11. In some embodiments, a non-transitory computer readable medium stores instructions that, when executed by a processor, cause the processor to perform the steps of: accessing user-specific audio processing information for a particular user; determining identity information of an audio device for producing sound output from an audio signal; based on the identity information of the audio device, accessing device-specific audio processing information for the audio device; generating a customized audio-processing procedure for the audio signal based on the user-specific audio processing information and the device-specific audio processing information; and generating a customized audio signal by processing the audio signal with the customized audio-processing procedure.

12. The non-transitory computer readable medium of clause 11, wherein generating the customized audio-processing procedure for the audio signal based on the user-specific audio processing information and the device-specific audio processing information comprises generating the customized audio-processing procedure for the audio signal further based on environment-specific information.

13. The non-transitory computer readable medium of clauses 11 or 12, wherein the method further comprises determining the environment-specific information based on at least one of the identity information of the audio device and identity information of the particular user.

14. The non-transitory computer readable medium of any of clauses 11-13, wherein accessing user-specific audio processing information for the particular user comprises: receiving a user input indicating a specific equalization profile; and accessing the specific equalization profile.

15. The non-transitory computer readable medium of any of clauses 11-14, wherein generating the customized audio-processing procedure comprises generating the customized audio-processing procedure based on the specific equalization profile.

16. The non-transitory computer readable medium of any of clauses 11-15, wherein the method further comprises generating the specific equalization profile based on a personalization test performed by the particular user.

17. The non-transitory computer readable medium of any of clauses 11-16, wherein accessing user-specific audio processing information for the particular user comprises: determining identity information of the particular user; and based on the identity information of the particular user, retrieving the user-specific audio processing information from a cloud-based repository.

18. The non-transitory computer readable medium of any of clauses 11-17, wherein accessing user-specific audio processing information for the particular user comprises: determining identity information of the particular user; and based on the identity information of the particular user, retrieving the user-specific audio processing information from a computing device configured for generating the customized audio-processing procedure.

19. The non-transitory computer readable medium of any of clauses 11-18, wherein generating the customized audio processing procedure comprises generating a composite sound equalization curve from information included in at least one of the user-specific audio processing information or the device-specific audio processing information.

20. In some embodiments, a system, comprises: a memory that stores instructions; and a processor that is coupled to the memory and is configured to perform the steps of, upon executing the instructions: accessing user-specific audio processing information for a particular user; determining identity information of an audio device for producing sound output from an audio signal; based on the identity information of the audio device, accessing device-specific audio processing information for the audio device; generating a customized audio-processing procedure for the audio signal based on the user-specific audio processing information and the device-specific audio processing information; and generating a customized audio signal by processing the audio signal with the customized audio-processing procedure.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in at least one computer readable medium having computer readable program code embodied thereon.

Any combination of at least one computer readable medium may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having at least one wire, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method of audio signal processing, the method comprising:
   accessing user-specific audio processing information for a particular user;
   determining identity information of an audio device for producing sound output from an audio signal;
   based on the identity information of the audio device, accessing device-specific audio processing information for the audio device;
   generating a composite sound equalization curve for the audio signal based on the user-specific audio processing information and the device-specific audio processing information;
   generating non-linear processing for the audio signal based on the user-specific audio processing information;
   generating a customized audio-processing procedure for the audio signal based on the composite sound equalization curve and the non-linear processing; and
   generating a customized audio signal by processing the audio signal with the customized audio-processing procedure.

2. The method of claim 1, further comprising, causing the audio device to produce sound output from the customized audio signal.

3. The method of claim 2, wherein causing the audio device to produce sound output from the customized audio signal comprises transmitting the customized audio signal to the audio device via a wireless connection.

4. The method of claim 3, wherein the processing of the audio signal with the customized audio-processing procedure is performed via a processor external to the audio device.

5. The method of claim 2, wherein the processing of the audio signal with the customized audio-processing procedure is performed via a processor included in the audio device.

6. The method of claim 1, wherein accessing the user-specific audio processing information for the particular user comprises:
   determining identity information of the particular user; and
   based on the identity information of the particular user, retrieving the user-specific audio processing information from a cloud-based repository.

7. The method of claim 1, wherein accessing the user-specific audio processing information for the particular user comprises:
   determining identity information of the particular user; and
   based on the identity information of the particular user, retrieving the user-specific audio processing information from a computing device configured for generating the customized audio-processing procedure.

8. The method of claim 1, wherein generating the customized audio-processing procedure comprises generating the composite sound equalization curve from information included in at least one of the user-specific audio processing information or the device-specific audio processing information.

9. The method of claim 8, wherein generating the composite sound equalization curve comprises combining all sound equalization curves included in the user-specific audio processing information or the device-specific audio processing information.

10. The method of claim 8, wherein generating the customized audio signal with the customized audio-processing procedure comprises:
    generating a modified audio signal by modifying the audio signal with the composite sound equalization curve; and
    performing a gain-modifying operation indicated in at least one of the user-specific audio processing information or the device-specific audio processing information on the modified audio signal.

11. A non-transitory computer readable medium storing instructions that, when executed by a processor, cause the processor to perform steps of:
    accessing user-specific audio processing information for a particular user;
    determining identity information of an audio device for producing sound output from an audio signal;
    based on the identity information of the audio device, accessing device-specific audio processing information for the audio device;
    generating a composite sound equalization curve for the audio signal based on the user-specific audio processing information and the device-specific audio processing information;
    generating non-linear processing for the audio signal based on the user-specific audio processing information;
    generating a customized audio-processing procedure for the audio signal based on the composite sound equalization curve and the non-linear processing; and
    generating a customized audio signal by processing the audio signal with the customized audio-processing procedure.

12. The non-transitory computer readable medium of claim 11, wherein generating the customized audio-processing procedure for the audio signal based on the user-specific audio processing information and the device-specific audio processing information comprises generating the customized audio-processing procedure for the audio signal further based on environment-specific information.

13. The non-transitory computer readable medium of claim 12, wherein the steps further comprise determining the environment-specific information based on at least one of the identity information of the audio device or identity information of the particular user.

14. The non-transitory computer readable medium of claim 11, wherein accessing the user-specific audio processing information for the particular user comprises:
    receiving a user input indicating a specific equalization profile; and
    accessing the specific equalization profile.

15. The non-transitory computer readable medium of claim 14, wherein generating the customized audio-processing procedure comprises generating the customized audio-processing procedure based on the specific equalization profile.

16. The non-transitory computer readable medium of claim 14, wherein the steps further comprise generating the specific equalization profile based on a personalization test performed by the particular user.

17. The non-transitory computer readable medium of claim 11, wherein accessing the user-specific audio processing information for the particular user comprises:

determining identity information of the particular user; and based on the identity information of the particular user, retrieving the user-specific audio processing information from a cloud-based repository.

18. The non-transitory computer readable medium of claim 11, wherein accessing the user-specific audio processing information for the particular user comprises:

determining identity information of the particular user; and based on the identity information of the particular user, retrieving the user-specific audio processing information from a computing device configured for generating the customized audio-processing procedure.

19. The non-transitory computer readable medium of claim 11, wherein generating the customized audio-processing procedure comprises generating the composite sound equalization curve from information included in at least one of the user-specific audio processing information or the device-specific audio processing information.

20. A system, comprising:

a memory that stores instructions; and a processor that is coupled to the memory and is configured to perform steps of, upon executing the instructions:

accessing user-specific audio processing information for a particular user;

determining identity information of an audio device for producing sound output from an audio signal;

based on the identity information of the audio device, accessing device-specific audio processing information for the audio device;

generating a composite sound equalization curve for the audio signal based on the user-specific audio processing information and the device-specific audio processing information;

generating non-linear processing for the audio signal based on the user-specific audio processing information;

generating a customized audio-processing procedure for the audio signal based on the composite sound equalization curve and the non-linear processing; and generating a customized audio signal by processing the audio signal with the customized audio-processing procedure.

* * * * *